(12) United States Patent
Young et al.

(10) Patent No.: US 8,872,190 B1
(45) Date of Patent: Oct. 28, 2014

(54) MULTI-FINGER HEMT LAYOUT PROVIDING IMPROVED THIRD ORDER INTERCEPT POINT AND SATURATED OUTPUT POWER PERFORMANCE

(71) Applicant: M/A-COM Technology Solutions Holdings, Inc., Lowell, MA (US)

(72) Inventors: Alan C. Young, Corlette (AU); Simon J. Mahon, Avalon (AU)

(73) Assignee: M/A-COM Technology Solutions Holdings, Inc., Lowell, MA (US)

( * ) Notice: Subject to any disclaimer, the term of this patent is extended or adjusted under 35 U.S.C. 154(b) by 0 days.

(21) Appl. No.: 13/644,612

(22) Filed: Oct. 4, 2012

Related U.S. Application Data

(63) Continuation-in-part of application No. 13/617,925, filed on Sep. 14, 2012, now abandoned.

(51) Int. Cl.
*H01L 31/0312* (2006.01)

(52) U.S. Cl.
USPC 257/77; 257/194; 257/E23.043; 257/E29.246

(58) Field of Classification Search
USPC .................................................. 257/77, 194
See application file for complete search history.

(56) References Cited

U.S. PATENT DOCUMENTS 7,442,635 B2 * 10/2008 Das et al. ..................... 438/621

* cited by examiner

*Primary Examiner* — Dung A. Le
(74) *Attorney, Agent, or Firm* — Christopher P. Maiorana, PC

(57) ABSTRACT

A semiconductor device including a plurality of source pads, a plurality of drain fingers, a plurality of gate fingers, a drain combiner connected to the plurality of drain fingers, and a gate combiner connected to the plurality of gate fingers. The plurality of source pads generally comprises a pair of end source pads and one or more inner source pads. Each end source pad is configured to have added inductance. Each of the drain fingers is generally disposed between two of the plurality of source pads. Each of the gate fingers is generally disposed between a respective source pad and a respective drain finger.

15 Claims, 5 Drawing Sheets

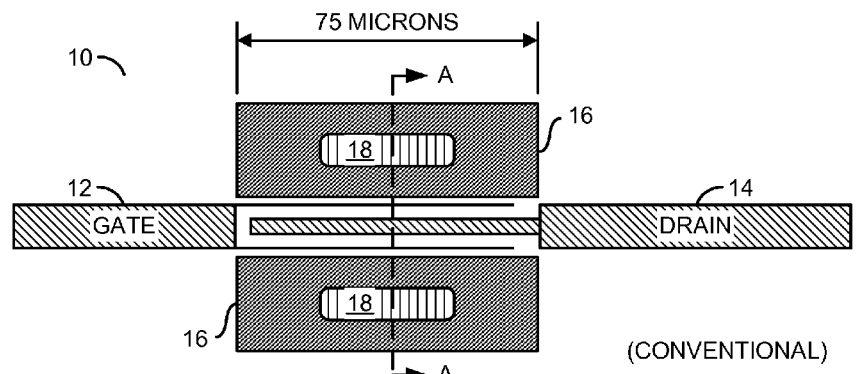
(CONVENTIONAL)
FIG. 1
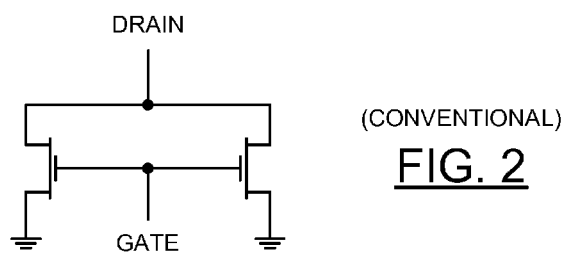
(CONVENTIONAL)
FIG. 2
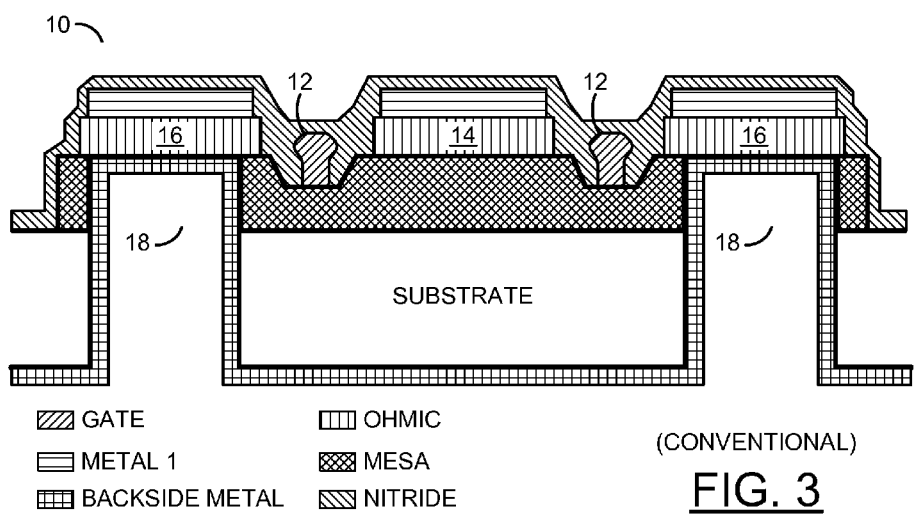
(CONVENTIONAL)
FIG. 3

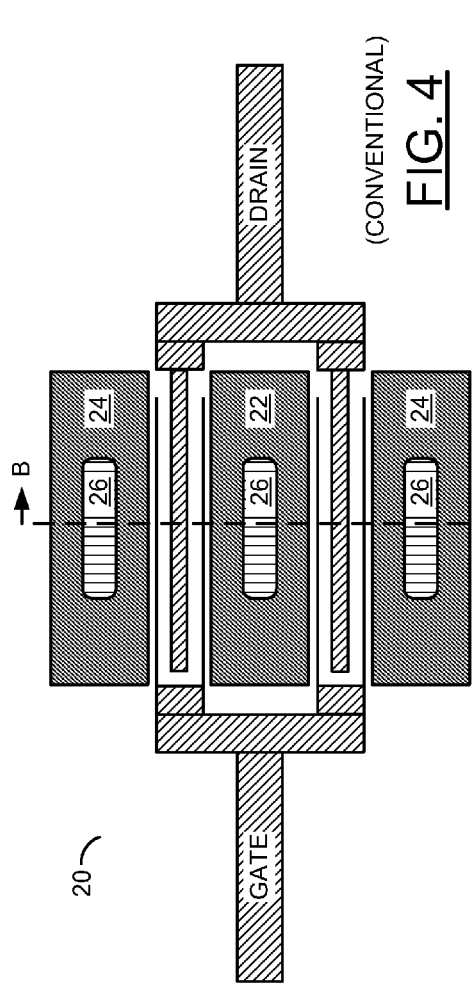
FIG. 4 (CONVENTIONAL)
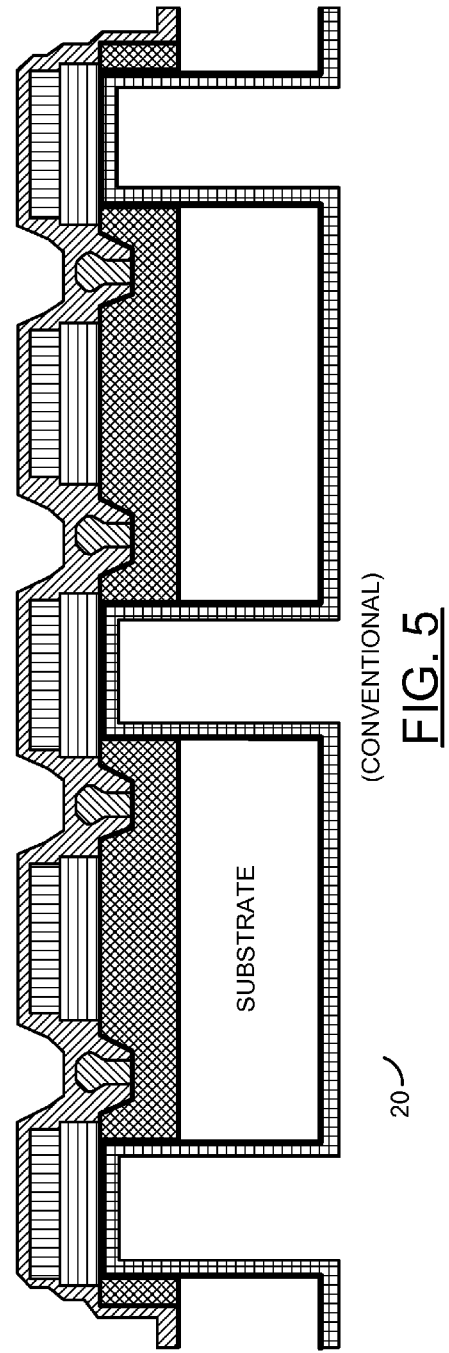
FIG. 5 (CONVENTIONAL)

(CONVENTIONAL)
(a)

(b)

▨ AIR OR OTHER INSULATOR (E.G., SO$_2$)

MULTI-FINGER HEMT LAYOUT PROVIDING IMPROVED THIRD ORDER INTERCEPT POINT AND SATURATED OUTPUT POWER PERFORMANCE

This is a continuation-in-part of U.S. Ser. No. 13/617,925 filed Sep. 14, 2012, which is incorporated by reference in its entirety.

FIELD OF THE INVENTION

The present invention relates to semiconductor devices generally and, more particularly, to a method and/or apparatus for implementing a multi-finger HEMT layout providing improved third order intercept point (OIP3) and saturated output power performance (Psat).

BACKGROUND OF THE INVENTION

Referring to FIG. 1, a diagram is shown illustrating a layout of a conventional two-finger high electron mobility transistor (HEMT) 10. The two-finger HEMT 10 is the most basic transistor used in a frequency range up to at least 50 GHz. The two-finger HEMT typically has a gate width of 75 microns. The two-finger HEMT 10 is essentially a parallel combination of two transistors side-by-side. FIG. 2 is a schematic diagram illustrating a DC equivalent circuit for the two-finger HEMT 10 of FIG. 1. A gate line 12 on the left of the two-finger HEMT 10 feeds two very thin gate fingers. The gate fingers control two channel currents flowing from a central common drain line 14 to two source pads 16. The source pads 16 are usually grounded with "via-holes" 18 in the center of the source pads 16. A cross-section of the two-finger HEMT 10 at section line A-A is illustrated in FIG. 3.

The basic device represented by the two-finger HEMT 10 has been extensively measured, modeled and used. The main limitation of the conventional two-finger HEMT 10 is in the power handling and third order intercept point (OIP3) capability. The OIP3 is an inverse measure of the magnitude of unwanted intermodulation products and is generally 10 to 15 dB above P1dB. P1dB is the maximum output power before significant compression begins. P1dB is typically just a few dB below the saturated power. OIP3 and P1dB are industry-standard terms.

High output power is usually necessary in transmitters. Good intermodulation performance is also important to avoid spectral regrowth and inter-symbol interaction when using wide bandwidth modulation schemes. What is not so apparent is that high OIP3 values are also needed in receivers to avoid increased bit error rate (BER) due to intermodulation products from high-level nearby interfering signals. To handle higher power and to increase OIP3, larger transistors with four or eight fingers are constructed. Gate finger width (i.e., the length of the gate lines in FIG. 1) could also be increased. However, increasing the length of the gate lines also increases gate resistance and delay. The increase in gate resistance and delay reduces high-frequency performance.

Referring to FIG. 4, a diagram of a four-finger HEMT 20 is shown illustrating a layout of a larger conventional transistor that finds common use. The four-finger HEMT 20 is simply a doubling of the two-finger HEMT 10. A cross-section of the four-finger HEMT 20 along section line B-B is illustrated in FIG. 5. The four-finger HEMT 20 takes twice the current of the two-finger HEMT 10 and achieves almost twice the output power. Surprisingly, however, P1dB and OIP3 values for the four-finger HEMT 20 are not quite doubled. The reason was not previously well understood but some recent ground-breaking research has provided the ability to study the operation of individual fingers in the larger devices and to design custom structures. The research has also allowed the performance of structures to be predicted without multiple prototyping runs. Importantly, the reason for the reduced performance in larger devices has been identified.

The first issue identified can be explained without resorting to complex analysis by the following reasoning, which is based on the four-finger HEMT 20 illustrated in FIG. 4. In a typical four-finger device, a central source pad 22 is shared between the two central fingers, whereas outer source pads 24 are not shared. The central source pad 22, therefore, has twice the current to ground relative to that in each outer source pad 24. HEMTs designed for millimeter-wave operation typically have a quiescent current of around 20 mA per gate finger and when operating at high power, the current swings from almost zero to 40 mA per finger. The source pads 22 and 24 are connected to ground through via-holes 26. The source pad connection to ground through via-hole 26 has an inductive reactance of around 6 ohms to ground at 50 GHz. When operating at high power, the central source pad 22 has an RF voltage to ground of V=IZ=2×40 mA×6 ohms=480 mV (peak to peak). In contrast, the outer source pads 24 will have half the voltage of the central source pad 22 or 240 mV due to the lower current. Although the above figures do not appear large, even small impedances in the source line can have quite large effects.

The outer fingers then have half the RF voltage on their source pads compared to the inner fingers. An alternative way of looking at this is that the central fingers share the inductance to ground and effectively see double the inductance as a result. To remove this unbalance, the central source (or sources in, e.g., eight-finger devices) could be separated into two separate pads, but separating the central source pad(s) would result in a physically larger device, and chip area is expensive. This is especially true for the eight-finger devices.

A study, which looked at the larger transistors, found that the outermost fingers contribute 3.0 dB less than optimal as the load impedance experienced by the outermost fingers is affected by the effective source inductance of the outermost fingers, which is approximately half that of the other fingers, all of which share back-via connections to ground. In large power transistors, the outermost fingers have only half the expected contribution to the overall OIP3 due to the different geometry of the surrounding metal that they see. The outermost fingers in the large power transistors use the same DC as the other fingers, but do not contribute equally due to their need to see a quite different load impedance due to the different geometry. The result is that in eight-finger devices, the overall device OIP3 is almost 1 dB less than expected. The same thing happens in both four and eight-finger devices, and even in larger devices.

Additionally, in a conventional eight-finger transistor, the optimal load is not presented simultaneously to all gate fingers. The inner-facing, outer fingers contribute 0.7 dB less than optimal to the linearity of the device as the additional length along the drain combiner shifts the load impedance experienced by those gate fingers. The outermost fingers contribute 3.0 dB less than optimal as the load impedance experienced by the outermost fingers is further affected by the respective effective source inductance, which is approximately half of the other fingers, all of which share back-via connections to ground.

It would be desirable to implement a multi-finger HEMT layout providing improved third order intercept point (OIP3) and saturated output power performance (Psat).

SUMMARY OF THE INVENTION

The present invention concerns a semiconductor device including a plurality of source pads, a plurality of drain fingers, a plurality of gate fingers, a drain combiner connected to the plurality of drain fingers, and a gate combiner connected to the plurality of gate fingers. The plurality of source pads generally comprises a pair of end source pads and one or more inner source pads. Each end source pad is configured to have added inductance. Each of the drain fingers is generally disposed between two of the plurality of source pads. Each of the gate fingers is generally disposed between a respective source pad and a respective drain finger.

The objects, features and advantages of the present invention include providing a multi-finger HEMT layout that may (i) provide improved third order intercept point (OIP3), (ii) provide improved saturated output power performance (Plat), (iii) equalize an electrical distance between a plurality of drain fingers and a common point of a drain combiner, (iv) equalize an electrical distance between a plurality of gate fingers and a common point of a gate combiner, and/or (v) form connections using an air bridge or equivalent structure.

BRIEF DESCRIPTION OF THE DRAWINGS

These and other objects, features and advantages of the present invention will be apparent from the following detailed description and the appended claims and drawings in which:

FIG. 1 is a diagram illustrating a conventional two-finger high electron mobility transistor (HEMT) layout;

FIG. 2 is a schematic diagram illustrating a DC equivalent circuit of the two-finger HEMT of FIG. 1;

FIG. 3 is a diagram illustrating a cross-section of the two-finger HEMP of FIG. 1;

FIG. 4 is a diagram illustrating a conventional four-finger HEMT layout;

FIG. 5 is a diagram illustrating a cross-section of the four-finger HEMP of FIG. 4;

DETAILED DESCRIPTION OF THE PREFERRED EMBODIMENTS

Embodiments of the present invention generally provide an improvement to the construction of multi-finger high electron mobility transistors (HEMTs). The improvements provided by the techniques in accordance with embodiments of the present invention generally improve third order intercept point (OIP3) and saturated output power performance (Psat) without any increase in chip area or increase in DC supply power.

Figure 6:
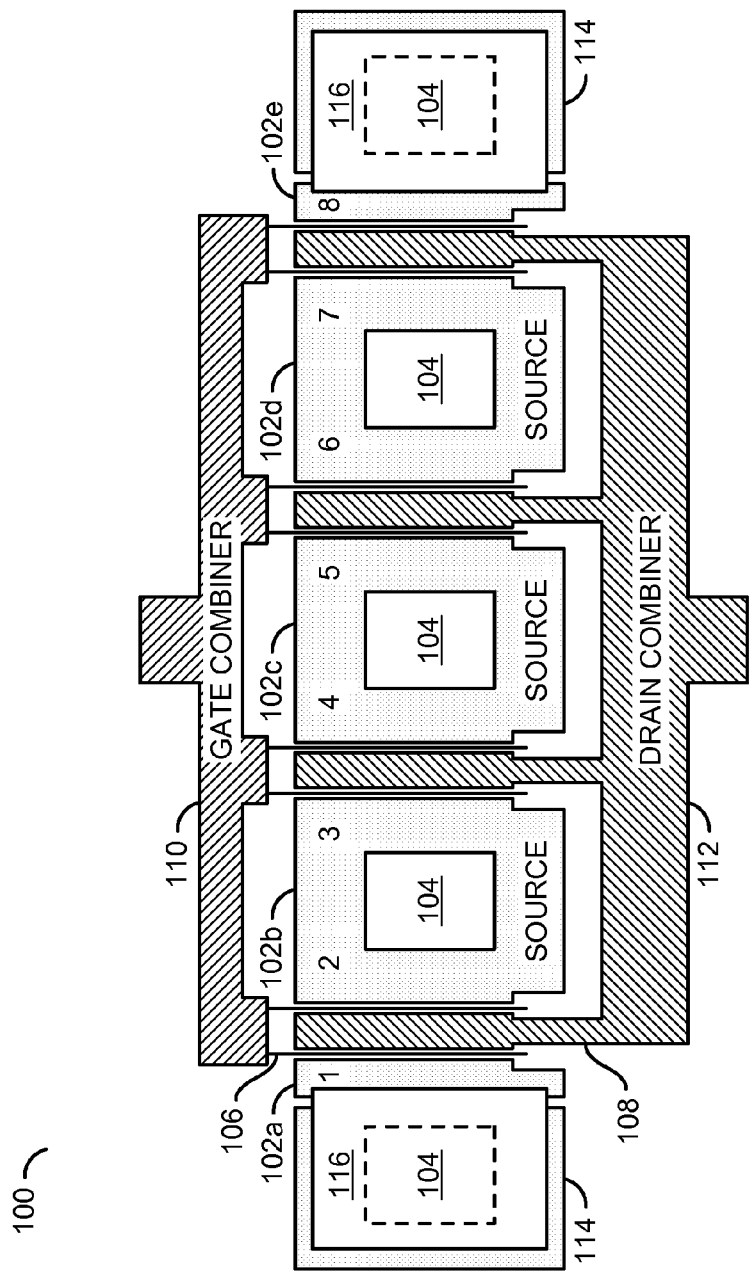
FIG. 6 is a diagram illustrating an eight-finger transistor layout in accordance with an embodiment of the present invention.

Referring to FIG. 6, a diagram is shown illustrating an eight-finger high electron mobility transistor (HEMT) layout 100 in accordance with an embodiment of the present invention. In one example, the eight-finger HEMT layout 100 may comprise five source pads 102a-102e, five ground vias (or back-vias) 104, eight gate fingers 106, four drain fingers 108, a gate combiner 110, and a drain combiner 112. A solution to the problem of the outer fingers contributing less than expected due to a reduced source inductance is to add some inductance to the outer source pads and ground vias. The inner source pads 102b-102d may be connected to respective back-vias 104 using conventional techniques. The outer source pads 102a and 102e (associated with fingers 1 and 8) are coupled to respective ground pads 114 by air bridge coupling structures (e.g., air bridge couplings or equivalent structures) 116 in accordance with embodiments of the present invention. The ground pads 114 are separated from the source pads 102a and 102e and may be connected to respective ground vias 104 using conventional techniques.

For larger devices (e.g., four or more fingers), the problem of longer drain and gate line lengths to the outer fingers may be addressed by equalizing the path lengths in accordance with embodiments of the present invention. The gate combiner 110 and/or the drain combiner 112 may implement air bridge couplings in accordance with embodiments of the present invention as well (described below in connection with FIG. 8). The longer drain and gate line lengths appear to have a smaller effect than that of the source inductance, but are likely to have a bigger impact at ever higher frequencies. A similar approach to that used for the outer source pads 102a and 102e may be used to regain the small loss in fingers 2 and 7 (and 1 and 8) by adding extra path length in the gate lines of the inner fingers 3, 4, 5 and 6 (as illustrated in FIG. 8) to equalize the drive phase for all fingers.

Figure 7:
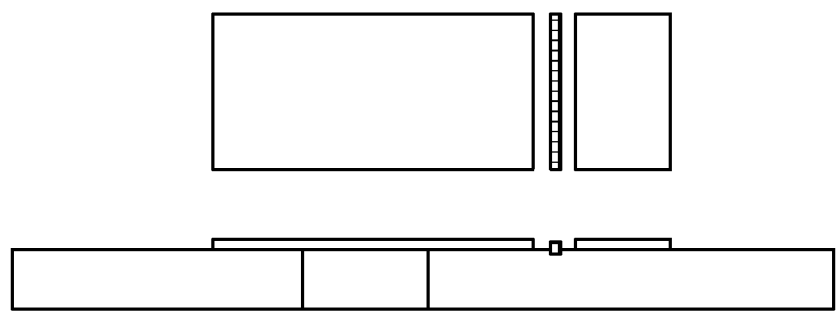
FIG. 7 is a diagram illustrating (a) a conventional end source pad and (b) an end source pad in accordance with an embodiment of the present invention.
Figure 7:
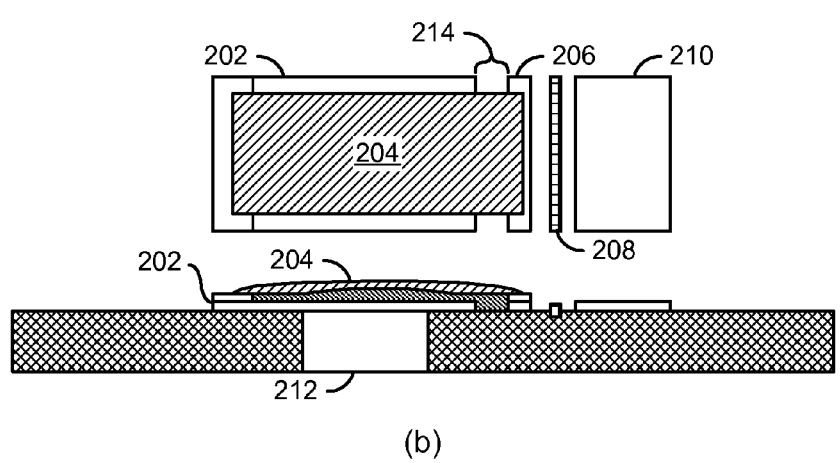

Referring to FIG. 7, a diagram is shown illustrating (a) an end (or outer) source pad of a conventional HEMT 50 and (b) an end (or outer) source pad of a HEMT 200 implemented in accordance with an embodiment of the present invention. To solve the problem of the outer fingers contributing less than expected due to reduced source inductance, inductance may be added to the outer source pads and ground vias. The simplest way to add inductance to the outer source pads and ground vias is to move the ground via a short distance away from the source pad and run a short thin line from the ground via to the source pad. However, moving the ground via a short distance away from the source pad and running a short thin line from the ground via to the source pad means a larger total HEMT size. Because chip area is expensive, a better alternative is to leave the ground via in position and run a short line from the source pad at the finger region over the ground via, but insulated from the ground via (e.g., using an air bridge or insulated with silicon dioxide ($SiO_2$), silicon nitride (SiN or $SiN_x$), or other insulator), to the far side of the ground via, where the line may be joined to a ground pad. For example, silicon nitride would generally be selected as the insulator for gallium arsenide (GaAs) monolithic microwave integrated circuits (MMICs).

In one example, the HEMT 200 may comprise a ground pad 202, an air bridge coupling 204, a source pad 206, a gate finger 208, a drain finger 210, and a ground via (or back-via) 212. The ground pad 202 is generally separated from the source pad 206 by a gap 214. The air bridge coupling 204 is generally placed such that a first end of the air bridge coupling 204 is in contact with the source pad 206 and a second end of the air bridge coupling 204 is in contact with the ground pad 202. The second end of the air bridge coupling 204 is connected such that the source pad 206 connects to the ground pad 202 farther away from the source pad 206 than in the conventional HEMT 50. The point at which the second end of the air bridge coupling 204 contacts the ground pad 202 is generally determined by the amount of inductance to be added. A position of the source pad 206 with respect to the gate finger 208 and the drain finger 210 is generally similar to the conventional HEMT 50. The air bridge coupling 204 and the source pad 206 are generally insulated from the ground pad 202 by air or an insulator other than air (e.g., silicon dioxide (SiO$_2$), silicon nitride (SiN or SiN$_x$), etc.). The ground pad 202 is generally connected to the ground via 212. The point at which the air bridge coupling 204 makes contact with the ground pad 202 may be varied to set the amount of additional inductance provided.

Figure 8:
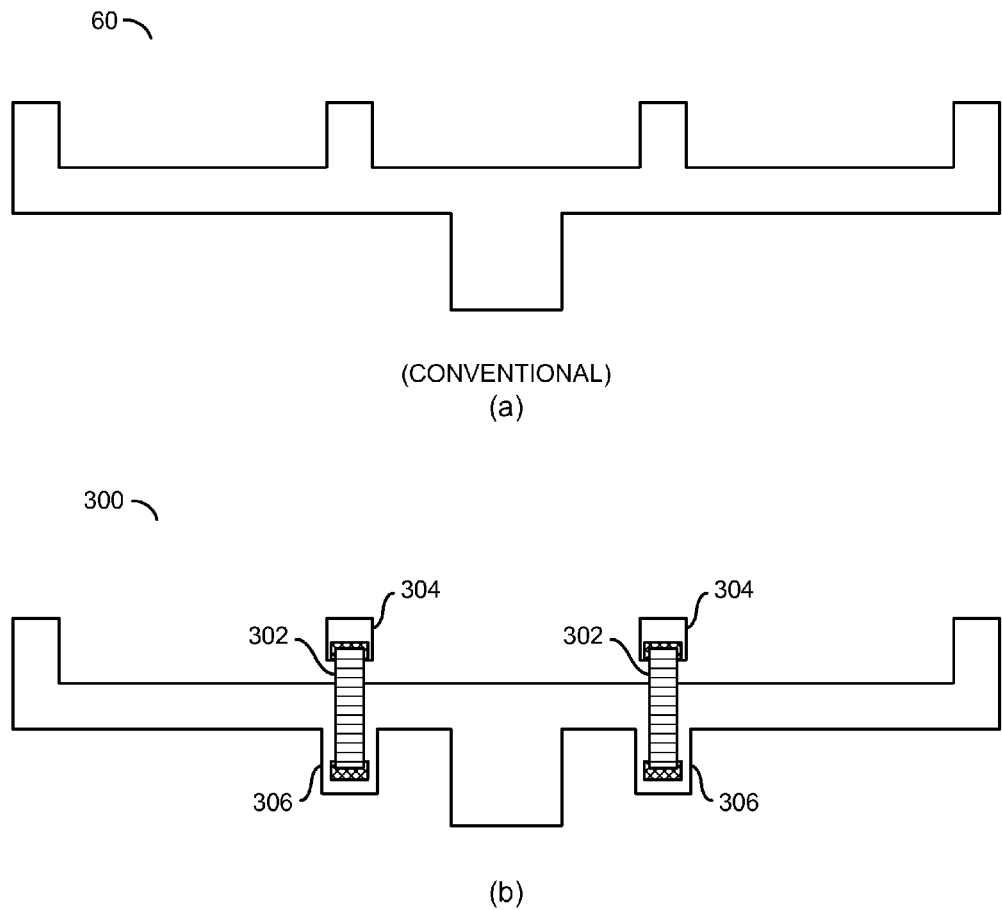
FIG. 8 is a diagram illustrating (a) a conventional gate or drain combiner and (b) a gate or drain combiner in accordance with an embodiment of the present invention.

Referring to FIG. 8, a diagram is shown illustrating a comparison between (a) a conventional gate or drain combiner 60 and (b) a gate or drain combiner 300 implemented in accordance with an embodiment of the present invention. For larger devices, there is the additional consideration of longer drain and gate line lengths to the outer fingers. The longer drain and gate line lengths generally appear to have a smaller effect than that of the source inductance, but are likely to have a bigger impact at ever higher frequencies. A similar approach to that used for the outer source pads may be used to regain the small loss in the outer fingers (e.g., 2 and 7 and 1 and 8, in an eight-finger device) by adding extra path length in the gate and/or drain lines of the inner fingers (e.g., 3, 4, 5, and 6 in the eight-finger device) to make the drive phase substantially similar for all fingers.

In the example of an eight-finger device, an air bridge coupling 302 may be used to form a connection from the gate lines and/or drain lines for the inner fingers 3, 4, 5, and 6 to the combiner 300. In one example, pads 304 connected to gate lines and/or drain lines for the inner fingers 3, 4, 5, and 6 may be coupled by air bridge couplings 302 routed over (and insulated from) a main portion of the gate or drain combiner 300 and connected to respective extensions 306 on an opposite side of the gate or drain combiner 300 from the gate line and/or drain line pads 304. The air bridge couplings 302 and extensions 306 generally allow the connection of the gate lines and/or drain lines to the combiner 300 to be farther away from the device channels. The extra path length generally provides a greater electrical distance than the conventional layout. The extra path length may be adjusted, for example, to equalize the gate drive phases. A similar scheme may be used for the drain combiner, the gate combiner, or both drain and gate combiners. In general, the gate and/or drain combiner transmission lines may be replaced through a similar use of air bridge couplings to equalize all line lengths. In another example, upper and lower metal may be used separated by capacitor dielectric in place of the air bridges. In still another example, an air bridge may be implemented for each gate finger (e.g., eight air bridges in an eight-finger device, etc.). However, the smaller size of the air bridge may result in a less robust device.

Embodiments in accordance with the present invention generally provide a new multi-finger device layout. Although the examples presented above are generally illustrated having four or eight fingers, the techniques described above are generally directly applicable to all HEMT devices with more than two fingers (e.g., n-finger devices, where n is any integer greater than 2). It would be apparent to those of ordinary skill in the field of the invention that multi-finger devices implementing features in accordance with embodiments of the present invention may be fabricated based on the above description using various conventional lithographic techniques (e.g., photolithography patterning, soft lithography, conformal phase shift lithography, etc.).

The new multi-finger device layout in accordance with embodiments of the present invention generally provides extra inductance in both outer source pads. The new multi-finger device layout in accordance with embodiments of the present invention generally also provides a technique for equalizing lines in both the gate and drain feed structures. The improvements to the source inductance may be implemented with or without implementing the improvements to the gate and/or drain combiners. In general, the techniques described above in accordance with embodiments of the present invention may achieve around 1 dB improvement in OIP3 at 40 to 50 GHz, and are likely to be even more important as technology moves to higher frequencies.

While the invention has been particularly shown and described with reference to the preferred embodiments thereof, it will be understood by those skilled in the art that various changes in form and details may be made without departing from the scope of the invention.

The invention claimed is:

1. A semiconductor device comprising;
   a plurality of source pads comprising (i) a pair of end source pads each comprising an air bridge coupling structure connected to a ground via and (ii) one or more inner source pads, wherein each end source pad is configured to have added inductance;
   a plurality of drain fingers, each disposed between two of said plurality of source pads;
   a plurality of gate fingers, each disposed between a respective source pad and a respective drain finger;
   a drain combiner connected to said plurality of drain fingers; and
   a gate combiner connected to said plurality of gate fingers.

2. The semiconductor device according to claim 1, wherein said air bridge coupling structure passes over a ground pad coupled to said ground via and said air bridge coupling structure is separated from said ground pad by air.

3. The semiconductor device according to claim 1, wherein said air bridge coupling structure passes over a ground pad coupled to said ground via and said air bridge coupling structure is separated from said ground pad by a layer of an insulator material other than air.

4. The semiconductor device according to claim 1, wherein said air bridge coupling structure passes over a ground pad coupled to said ground via and said air bridge coupling structure is separated from said ground pad by a layer of silicon nitride (SiN).

5. The semiconductor device according to claim 1, wherein connections between said plurality of drain fingers and said drain combiner are configured to equalize an electrical distance between said plurality of drain fingers and a drain terminal of said semiconductor device.

6. The semiconductor device according to claim 5, wherein two or more of said drain fingers are connected to said drain combiner via air bridge coupling structures.

7. The semiconductor device according to claim 1, wherein connections between said plurality of gate fingers and said gate combiner are configured to equalize an electrical distance between said plurality of gate fingers and a gate terminal of said semiconductor device.

8. The semiconductor device according to claim 7, wherein two or more of said gate fingers are connected to said gate combiner via air bridge coupling structures.

9. The semiconductor device according to claim 1, wherein:
   two or more of said drain fingers are connected to said drain combiner by air bridge coupling structures; and
   two or more of said gate fingers are connected to said gate combiner by air bridge coupling structures.

10. The semiconductor device according to claim 1, wherein said semiconductor device is a multi-finger high electron mobility transistor (HEMT).

11. The semiconductor device according to claim 10, wherein said semiconductor device has n fingers and n is an integer greater than two.

12. The semiconductor device according to claim 1, wherein one or more path lengths of said gate combiner are adjusted to equalize gate drive phases.

13. The semiconductor device according to claim 1, wherein one or more path lengths of said drain combiner are adjusted to equalize drain drive phases.

14. A method of fabricating a multi-finger semiconductor device comprising the steps of:
- forming a plurality of source pads comprising a pair of end source pads and one or more inner source pads, wherein each end source pad has an adjacent ground pad; and
- forming an air bridge coupling structure connecting each end source pad with the adjacent ground pad, wherein each air bridge coupling structure is configured to provide added inductance to the respective end source pad.

15. A semiconductor device comprising:
- a plurality of source pads comprising a pair of end source pads and one or more inner source pads, wherein each end source pad is configured to have added inductance;
- a plurality of drain fingers, each disposed between two of said plurality of source pads;
- a plurality of gate fingers, each disposed between a respective source pad and a respective drain finger;
- a drain combiner connected to said plurality of drain fingers, wherein two or more of said drain fingers are connected to said drain combiner by air bridge coupling structures; and
- a gate combiner connected to said plurality of gate fingers, wherein two or more of said gate fingers are connected to said gate combiner by air bridge coupling structures.

* * * * *